TRANSISTOR CLAMP CIRCUIT

Filed April 19, 1963

INVENTOR.
JOHN O. SCHROEDER
& JAMES F. MERRITT
BY Eugene M. Whitacre
attorney

United States Patent Office 3,268,658 Patented August 23, 1966

3,268,658

TRANSISTOR CLAMP CIRCUIT

John O. Schroeder, Hamilton Square, N.J., and James F. Merritt, Cocoa Beach, Fla., assignors to Radio Corporation of America, a corporation of Delaware Filed Apr. 19, 1963, Ser. No. 274,176
4 Claims. (Cl. 178—7.3)

This invention relates in general to electrical circuits employing semiconductor devices, and more particularly to television video and like signal-translating circuits adapted for keying or clamping control by semiconductor devices. These circuits depend for their operation upon the transmission of periodically recurring control pulses which are caused to go to certain fixed voltage levels. In television systems, these recurring pulses usually are the blanking and synchronizing pulses.

A keyed clamp circuit may provide for controlling the charge of a coupling capacitor in a signal translating circuit. The latter may be the signal input grid circuit of a kinescope tube controlled by diode means which are keyed by sync pulses. On each pulse, the diode means is rendered conducting in the proper direction whereby the capacitor will discharge a certain amount of its charge if it should be reduced to provide correct level setting, or it will charge a certain amount if its charge should be increased. It is desirable that keyed clamp circuits be balanced so that keying pulses will not appear on the signal in the clamped signal translating circuit.

It is an object of this invention to provide an improved keyed clamp circuit for level setting in a signal translating system to provide effective balanced operation without signal mixing.

It is a further object of this invention to provide an improved video signal keying or clamp circuit for television receivers.

It is also an object of the present invention to provide an improved signal level-setting circuit of the bidirectional clamp type in a television signal translating system.

A signal level-setting clamp circuit embodying the invention comprises an insulated-gate field-effect semiconductor device. Such a device has first and second, or source and drain, electrodes formed on a body or substrate of semiconductor material, and a gate electrode disposed therebetween and insulated from the substrate. The source and drain electrodes are connected to each other in the transistor structure by a current path or channel of conductivity controlled by the voltage between the gate and source electrodes. The current path between the source and drain electrodes is effectively connected in parallel relation to the signal translating circuit or channel to be controlled. Periodically, keying pulses applied to the gate electrode cause the internal source-to-drain path of the transistor to be activated (conductive) for a clamping interval. Current may then flow therethrough in either direction, and the single transistor may operate alternatively as a charging or discharging path for the coupling capacitor in the grid or other like circuit to be clamped.

The circuit further has the advantage of balanced control effect in that a keying pulse component will not appear on the clamped signal. This results from the fact that a very high resistance, with relatively low capacity coupling, exists between the gate electrode and the other electrodes. Therefore the control pulse voltage applied to the gate electrode does not produce a flow of current from the gate electrode to either one of the other electrodes and the circuits connected therewith, but controls the conductivity of the current path between the first and second electrodes without introducing unwanted additional current or signal components in the signal channel.

The drain-to-source dynamic resistance, as a function of the gate bias, in present transistors of this type, is found to vary from approximately 500 ohms to several hundred thousands. The resistance between the gate and other electrodes may be as high as $10^{14}$ ohms. The field-effect transistor can thus be used as a variable resistance or switch in a signal circuit with no external direct-current bias on the source or the drain electrodes.

The insulated gate electrode thus provides a relatively-high input impedance which requires only relatively-low keying pulse power to operate it. The transistor may operate as a switch in connection with the clamping voltage source for a signal translating circuit, which switch is open at all times except for the keying interval.

The gate electrode of the transistor is connected to ground through a rectifier device, which clamps the keying pulse tips to ground or other point of reference potential. A capacitor which couples the gate electrode to the keying pulse source is charged to a voltage which holds the transistor cut-off except during keying pulse interval. In accordance with a feature of the invention, the rectifier device may comprise the rectifying junction which appears between the substrate and grounded electrode of the insulated gate field-effect transistor.

The novel features which are considered characteristic of the invention are set forth with particularity in the appended claims. The invention itself, however, both as to its organization and method of operation as well as additional objects and advantages thereof, will best be understood from the following description when considered with reference to the accompanying drawings.

Figure 1:
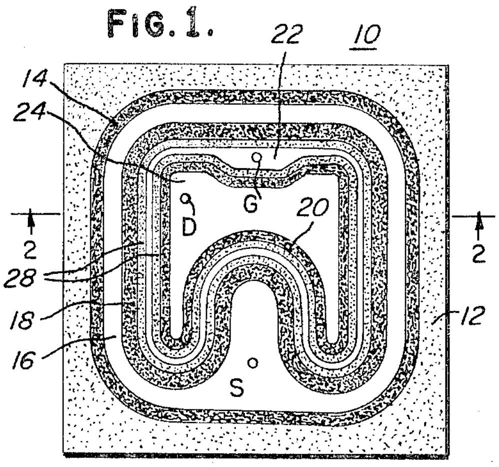
FIGURE 1 is a diagrammatic plan view of a field-effect transistor suitable for use in circuits embodying the invention and showing the major elements thereof.

Referring to the drawings and particularly to FIGURE 1, a field-effect transistor 10 which may be used with circuits embodying the invention includes a body or substrate 12 of any suitable semiconductor material as used in the semiconductor art, such as lightly doped P-type silicon. In manufacture, a silicon-dioxide layer or film, doped with N-type impurities, is deposited over the surface of the silicon body 12. The film is then removed by conventional photo-resist and acid etching processes or the like, where the gate electrode is to be formed and around the outer edges of the silicon wafer as shown. The deposited silicon-dioxide film is left over those areas where the source-drain regions are to be formed.

Figure 2:
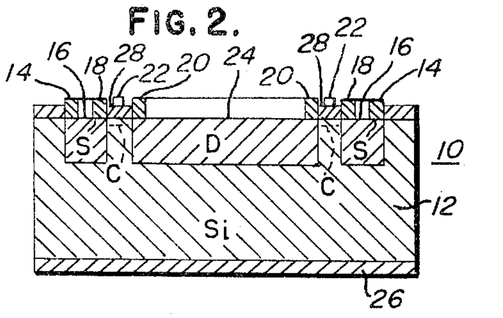
FIGURE 2 is a cross-sectional view of said transistor, taken on the section line 2—2 of FIGURE 1, further showing the elements and their operative relation.

The body 12 is then heated in a suitable atmosphere to form grown silicon-dioxide layers indicated by the stippled areas, and during the heating process, impurities from the deposited silicon-dioxide layer diffuse into silicon body 12 to form the source and drain regions. FIGURE 2 shows the source-drain regions labelled S and D respectively.

By means of another photo-resist and acid etching or like process, the deposited silicon-dioxide film over part of the source-drain diffused regions is removed. Electrodes are formed for the source, drain and gate regions by evaporation of a conductive material, such as chromium or gold, but other suitable conductive materials may be used.

The finished wafer or body 12 may be in the form shown in FIGURE 1, in which the stippled area between the outside boundary and the first dark zone 14 is grown silicon dioxide. The white area 16 is the conductive electrode corresponding to the source electrode S, dark zones 14 and 18 are deposited silicon-dioxide zones overlying portions of the diffused source region and the dark zone 20 is a deposited silicon-dioxide zone overlying a portion of the diffused drain region. White areas 22 and 24 are the conductive electrodes which correspond to the gate G and drain D electrodes respectively. The stippled zone 28 is a layer of grown silicon-dioxide, on a portion of which the gate electrode 22 is placed, and which insulates that electrode from the substrate silicon body 12 and from the source and drain electrodes, as shown in FIGURE 2.

The silicon body is mounted on a conductive base or header 26 shown in FIGURE 2. The layer of grown silicon-dioxide 28 on which the gate electrode 22 is mounted, overlies an inversion layer or channel C connecting the source and drain regions. The gate electrode may be symmetrically disposed between the source and drain regions as shown, or may be displaced toward the source S for reducing the gate-to-drain capacitance.

The source electrode is defined as the electrode from which majority carriers flow, and the drain electrode as that electrode to which majority carriers flow. In the case of the device shown and described, with a P-type body or substrate and N-type source and drain regions, the majority carriers are electrons which flow toward the positive terminal. Accordingly, since the device is substantially symmetrical, the one of the electrodes 16 and 24 to which the positive potential of a supply source is applied operates as the drain electrode. If the device has an N-type substrate or wafer, the majority carriers are holes, and the electrode to which the negative terminal of a supply source is applied operates as the drain electrode.

Figure 3:
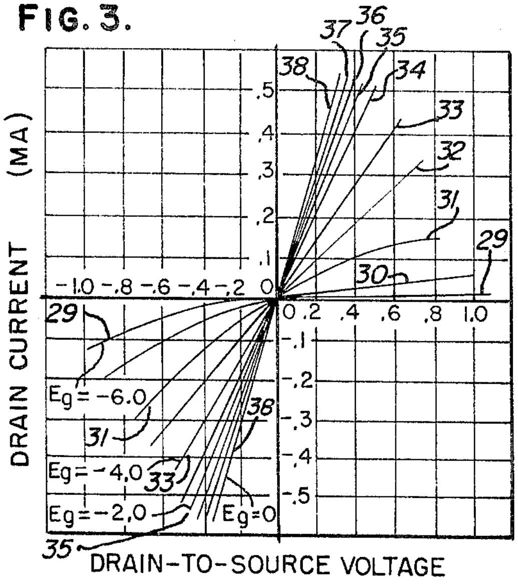
FIGURE 3 is a graph showing a family of drain current versus drain-to-source voltage curves for various values of gate-to-source voltages for the transistor of FIGURE 1.

FIGURE 3 shows a family of curves 29–38 illustrating the linear portion, below the knee of the drain-current versus drain-voltage characteristic of the insulated-gate field-effect transistor shown in FIGURE 1, for different values of gate-to-ground or gate-to-source bias voltage.

The portions of the curves 29–38 shown in the first quadrant in FIGURE 3 were obtained by applying a potential to the drain electrode which is positive with respect to the potential of the source electrode, and by biasing the gate electrode with respect to the source electrode by a voltage having a magnitude as indicated by the dimension of $E_g$ (gate voltage) corresponding to each of the curves 29–38. The portions of the curves 29–38 corresponding to the third quadrant were obtained by reversing the polarity of the voltage applied across the source and drain current path. These curves at 36–37–38, for example, show that the device has relatively low resistance when turned on and can conduct bidirectionally between the source and drain electrodes, or through the conduction channel or path C.

A further feature of an insulated-gate field-effect transistor is that the zero bias characteristic can be at any one of the curves 29–38 shown. In the present example, the curve 38 corresponds to the zero-bias voltage curve, as indicated by the notation $E_g=0$. Somewhat similar curves may be obtained that represent positive gate voltages relative to the source. In the present example, the curves are all below the zero bias point, thereby representing negative gate voltages relative to the source, as indicated, and a "depletion" mode of operation hereinafter referred to.

The location of the zero bias curve is selected during the manufacture of the transistor, i.e., by controlling the time and/or temperature of the step of the process when the silicon-dioxide layer 28 shown in FIGURES 1 and 2 is grown. Generally, as presently manufactured, the longer the transistor is baked and the higher the temperature, in a dry oxygen atmosphere, the larger the drain current will be for a given amount of drain voltage at zero bias between the source and gate electrodes.

Figure 4:
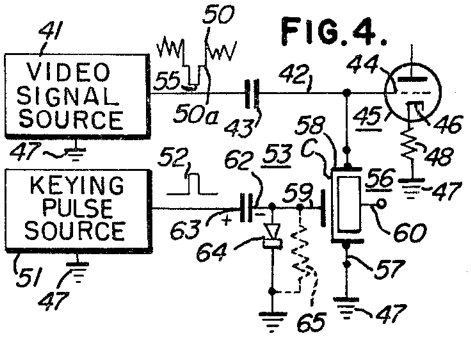
FIGURE 4 is a schematic circuit diagram of a signal keying or clamping circuit embodying the invention.

Reference is now made to FIGURE 4 which is a schematic circuit diagram of a keying or clamp circuit in accordance with the invention, including an insulated-gate field-effect transistor 56 similar to the one described in connection with FIGURES 1 and 2, as applied to a high-impedance signal translating system. In this system, the signal output side of a source 41 of video signals is coupled through a capacitor 43 and a circuit lead 42 to an input grid or electrode 44 of a subsequent stage or utilization device 45. This may be an electronic-tube amplifier having a cathode 46 connected to system ground 47 through a suitable bias resistor 48. The stage 45 may represent a stage of a television receiver, for which it is desirable or requisite that the applied video signal contain the proper D.-C. and/or low-frequency components. The video signal wave 50 appearing at the output circuit of the source 41 has periodically recurring control periods such as the blanking intervals 50*a*, during which occur periodic reference and control signals 55.

In the present example, a source 51 supplies periodically-recurring keying pulses 52 to key into operation, during a selected portion of each control period, a clamp or control circuit 53 for adjusting the charge on the coupling capacitor 43 whereby the circuit lead 42 or the grid 44 of the stage 45 may be brought to a predetermined potential or clamping level which is the same during each control period. The keying pulses 52 are timed to coincide with recurrent portions of the video signal and, in the present example, are timed to occur during pulse peaks 55 of the video signal 50.

The clamp circuit 53 includes an insulated-gate field-effect transistor 56 similar to the one described in FIGURES 1 and 2. The transistor 56 has a source electrode 57, a drain electrode 58, a gate electrode 59 and a substrate of semiconductor material with an electrode 60. The source electrode 57 is connected to a point of reference potential shown as system ground 47 in the present example. The drain electrode 58 is connected to the video signal translating channel at the circuit lead 42 which, as indicated, may be part of the input grid circuit of a video or like signal amplifier.

The source of video input signals 41 is thus effectively connected across the channel C of controllable conductivity or resistance between the source electrode 57 and the drain electrode 58. This internal source-to-drain path exhibits a resistance that is a function of the gate-to-source bias voltage and is effectively maximum or minimum or off-and-on, in response to relatively high keying pulse peaks such as the peaks 52.

The keying or control-pulse voltage source 51 is connected between the gate electrode 59 and system ground 47 as shown, through a supply lead 62 and a coupling capacitor 63 therein. A diode 64 is connected from the gate electrode 59, or the pulse circuit lead 62, to system ground 47 and is poled to conduct to ground on positive pulse peaks 52 at the gate, and sets the keying pulse tips at ground and the base at a negative value. See FIGURE 5, for example. The coupling capacitor 63 in the pulse circuit is charged on positive-going pulse peaks by current through the diode. The charge leaks off slowly through the back-resistance of the diode as indicated in dotted outline at 65. The time constant of the resistance means 65 and the capacitor 63 in combination, is such that the gate is biased sufficiently negatively during the interval between the keying pulses to maintain the transistor 56 cut-off.

Thus, during each recurrent peak interval 55 of the video signal 50, the normally-open or highly resistive current path C of the transistor 56 is rendered conductive and reduced to a relatively low resistance by the action of the keying pulse 52. Current may then flow therethrough in either direction, the direction of flow depending upon the polarity of the potential difference between the signal level at the circuit lead 42 or the grid 44 and the reference potential or clamping level voltage, which is ground potential in the present example.

Due to the high resistance between the gate electrode 59 and either of the source and drain electrodes 57 and 58, substantially none of the keying pulse current flows in the video signal circuit. Accordingly the video signal is not contaminated by or subject to a pedestal level effect due to the keying pulses.

Figures 5, 6:
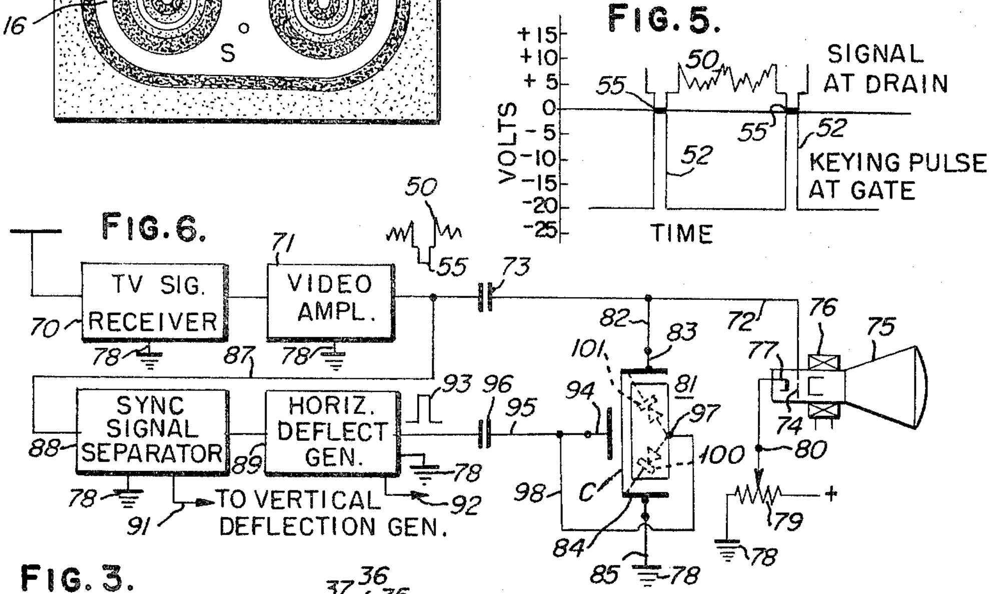
FIGURE 5 is a graph showing the timing and control relation between keying pulses and signal clamping in the circuit of FIGURE 4.
FIGURE 6 is a schematic circuit diagram of a television receiver showing the video signal channel thereof provided with a clamp circuit embodying the invention.

An application of the clamp circuit in a television receiving system is shown in FIGURE 6. A conventional television receiver 70 is provided for receiving and demodulating transmitted television signals. This may thus include the usual frequency converter and signal detector means by which composite television signals, including video and control signals, such as synchronizing and blanking pulses, are recovered from the received signals. A conventional video signal amplifier 71 is then provided for the composite signal output of the receiver.

The video amplifier 71 is coupled through a capacitor 73 and a video signal translating circuit lead 72 to the control grid 74 of a kinescope or picture tube 75. This may be of a conventional type as indicated, having the usual components such as a deflation yoke 76 and an electron gun including a cathode 77. The latter is connected with system ground 78 through a source of grid biasing potential provided by the variably-tapped resistor 79 having a positive potential supply connection with respect to ground, as indicated, and a bias adjustment contact 80 for the cathode.

Between the circuit lead 72 and system ground 78 is connected the variable resistance or conductive path C of an insulated-gate field-effect transistor 81 of the type as shown and described in connection with FIGURES 1 and 2. The lead 72 and system ground represent the high and low sides, respectively, of the video signal translating circuit of the receiver system. The video amplifier 71 is connected with system ground as indicated and thence to the grid-cathode circuit of the kinescope through ground at the bias source 79.

The signal translating circuit is connected through a lead 82 with the drain electrode 83 of the transistor 81, while the source electrode 84 is connected to the level setting voltage source or ground at 78 through a lead 85. As above noted, this places the variable conductance or resistance path C of the transistor in shunt relation to the signal translating circuit for controlling the clamping of the signal circuit conductor 72 and the grid 74 to ground potential on peaks 55 of the video signal 50, as in the preceding example for the circuit there described. It may be noted that the grid bias connection for the grid 74 is also completed through the resistive path C from the grounded end of the grid bias source 79.

Part of the output signal from the video amplifier is applied through an output lead 87, and system ground 78, to a synchronizing signal separator 88 which functions conventionally to separate the horizontal and vertical synchronizing pulses from the video signals and also from one another.

The separated horizontal and vertical synchronizing pulses are impressed respectively upon horizontal and vertical deflection generator means, of which only the horizontal deflection generator 89 is indicated. These function to produce voltage waves at horizontal and vertical deflection frequencies for the control of the electron beam deflection through suitable deflection means such as the yoke 76. As these circuits of the television receiver need not be described in detail for an understanding of the invention, only the output circuit connections therefor are indicated by the arrowed lines 91 and 92.

The horizontal deflection generator serves also as a source of the keying pulses 93 in timed relation to the signal peaks 55 of the video signal. These pulses are applied to the insulated gate electrode 94 of the transistor 81 through a circuit lead 95 and a coupling capacitor 96 therein, connected between the source 89 and the gate electrode. The gate electrode is further directly D.-C. conductively connected with the substrate electrode 97 through a connection lead 98.

A pair of internal rectifying junctions 101 and 100 effectively appear between the substrate electrode 97 and the drain and source electrodes 83 and 84, respectively. Assuming that the transistor 81 has P-type impurities in the substrate, the substrate comprises the anode portion of the rectifying junctions and the source and drain electrodes operate respectively as the cathode portions of the rectifying junctions, as indicated. If a transistor is used which has N-type impurities in the substrate, the rectifying junctions will be oppositely poled. In any case, the substrate electrode 97 is conductively connected for direct-current flow from the gate electrode 94 through the diode 100 to the source electrode 84 and system ground.

As the signal drives the gate electrode 94 and the substrate electrode 97 in the positive polarity direction, the rectifying junction 100 becomes conductive and limits the positive-going excursions of the signal and sets the tips of the keying pulses 52 at ground with a base line, at —20 v. (see FIGURE 5). The conduction of the rectifying junction 100 charges the coupling capacitor 96 in the pulse supply circuit. On negative cycles of the signal the capacitor 96 discharges through a back resistance of the diode 100, thereby establishing a negative bias voltage between the gate electrode 94 and source electrode 84 and holding the conductive path C effectively open. The time constant of the back-resistance and capacitor 96 network is much longer than the period of the pulse signal supplied by the control circuit 95–78. Accordingly, the pulse control circuit including the rectifying junction 100, effectively operates to hold the transistor 81 biased off between pulse intervals.

Periodically, as a signal peak 55 of the signal 50 appears at the grid 74 of the picture tube 75, a keying pulse 93 occurs in synchronism to switch the source-to-drain path C of transistor 81 into a conductive low resistance state. If there is any potential difference between the signal level in the translating circuit at grid 74 and the clamping level voltage or ground at this time, the coupling capacitor 73 is subject to either a charging or a discharging action through the source-to-drain path C of transistor 81, whichever is required to bring the signal circuit and the grid 74 to the clamping level. The picture brightness will thus be properly represented and maintained, due to the action of the keyed clamping circuit in adjusting the charge of coupling capacitor 73 to continually bring the signal level for the signal peaks 55 to a fixed clamping level, and holding the charge of the coupling capacitor 73 at the adjusted value throughout each subsequent video signal interval.

From the foregoing it will be seen that the signal level in the translating circuit is continuously adjusted. If the level is greater than the clamping level voltage, the capacitor 73 will discharge through the gate-controlled bidirectional conductive path C of the transistor during the clamping interval 93 until the potential of grid 74 is brought equal to the clamping level, or ground in this case. If the signal level at the grid 74 is smaller than the clamping level voltage, that is below ground in this case, then a charging current will flow in the opposite direction through the gate-controlled bidirectional conductive path C until the potential of grid 74 is brought equal to the clamping level.

As a keying pulse ends, the charge on the coupling capacitor 96 begins to leak off through the diode 100 back resistance and the source-to-drain path is held in a normal non-conductive state since the gate becomes biased negatively to a higher value such as —20 volts. The source-to-drain current path of the transistor 84 is thus cut-off leaving no path for current flow to change the charge on the signal circuit coupling capacitor 73. As the content of the signal portions intervening the reference intervals varies, the charge of the capacitor 73 is adjusted in the appropriate amount and direction by the keyed circuit to continually return the signal translating circuit 72–78 or the grid 74 to the clamping level at each reference interval.

In the circuit of FIGURE 6, as distinguished from the circuit of FIGURE 4, the internal substrate diode 100 is used as the capacitor charging and discharging rectifier in the keying pulse circuit. In this FIGURE 6 circuit the substrate diode 100 conducts when the keying pulse 52 goes positive with respect to the charge on the capacitor 96 and thereby acts as a D.-C. setter to set the keying pulse tips at ground and the base line therefor at some voltage negative thereto as indicated in FIGURE 5.

The composite video wave illustrated in FIGURE 5 of the drawings shows the synchronizing signal peaks extending in the negative direction. It should be understood that the composite video signal may also be phased so that the synchronizing signal peaks extend in the positive direction. Under the latter circumstances, the keying pulse should be large enough to generate a negative bias voltage at the gate and substrate electrodes which will be larger than the most negative portion of the video signal appearing at the conductor 72. In this manner the rectifying junction 101 between the substrate 97 and drain 83 electrodes will be maintained reversed biased between the keying pulses.

Referring to the foregoing description, the insulated-gate field-effect transistor operates as a switch for periodically setting the signal circuit to the level control point, which may be ground. It is open at all times except for the keying interval, at which time the normally negatively-biased gate is driven to zero, as indicated in the graph of FIGURE 5. When the video signals are applied across the source-to-drain current path through a signal coupling capacitor, the transistor effectively clamps the waveform so that the synchronizing tips are maintained at ground potential regardless of the average signal level. Because the insulated-gate field-effect transistor clamp circuit is bidirectional and can conduct in either direction during the keying interval, the charge on the video coupling capacitor 73 can be instantaneously increased or decreased depending on the changes in the picture content. The additional internal diode 101 in the substrate of the transistor does not interfere with circuit operation because it is reversed-biased at all times except during the keying interval. This is also indicated in the graph of FIGURE 5.

From the foregoing considerations of the insulated-gate field-effect transistor clamp circuits shown and described, it will be seen that this type of circuit (1) does not require a balanced source of keying pulses, (2) because of its high gate impedance, keying pulse power requirements are relatively minute, thereby permitting keying pulses to be derived from horizontal retrace pulses and the like, if desired without any active circuitry, (3) the clamp is balanced and the clamp pulses disturbance on the video signal translating circuit is relatively small, and (4) a minimum of circuit components are required for the circuit and involve a single transistor device together with one keying pulse coupling capacitor and one video signal circuit coupling capacitor.

What is claimed is:

1. In a circuit for correction of a signal supplied from a source and having recurrent control periods, the combination including, utilization means for said corrected signal, a first capacitor connected between said source and said utilization means, an insulated-gate field-effect transistor having source, drain and gate electrodes on a substrate of semiconductor material, a charging and discharging circuit for said capacitor, said circuit being connected between said utilization means and a point of reference potential for said circuit and including the drain-source path of said transistor, said drain-source path completing a charging circuit for said capacitor when the potential difference between the potential of said utilization means and said reference potential is of one polarity during a control period portion, and said drain-source path completing a discharging circuit for said capacitor when said potential difference is of the opposite polarity to said one polarity during a control period portion, means providing a source of keying signals coupled through a second capacitor to said gate electrode for rendering said drain-source path conductive during at least a portion of each of said control periods, and means direct current conductively connecting said gate electrode to said substrate.

2. In a television system including a source of video signals the direct current component of which is at least partially removed, an element to which it is desired to apply corrected video signals, and a first capacitor coupling said source to said element, the combination including, an insulated-gate field-effect transistor having source, gate and drain electrodes on a substrate of semiconductor material, means for connecting one of said source and drain electrodes to a point of reference potential, means for connecting the other of said source and drain electrodes to said element, and means including a second capacitor coupled to said gate electrode to apply thereto keying pulses for periodically keying the source-to-drain current path to said transistor to a highly conductive condition whereby current may flow between said source and drain electrodes to said transistor in a first direction when the signal potential at said element exceeds said reference potential, and in a direction opposite to said first direction when said reference potential exceeds the potential at said element, and means direct current conductively connecting said gate electrode to said substrate.

3. In a video signal translating system wherein a first capacitor couples an output terminal of one stage of said system to an input terminal of subsequent stage thereof in a manner that periodic synchronizing signal excursions are in the negative direction, a keyed clamping circuit comprising, an insulated field-effect gate electrode having source, gate and drain electrodes on a substrate of P-type semiconductor material, means for connecting one of said source and drain electrodes to said input terminal, means for connecting the other of said source and drain electrodes to a point of reference potential, a source of keying pulses timed to occur during the interval of said synchronizing signal excursions, means including a second capacitor coupled between said source of keying pulses and gate electrode for applying said keying pulses to said gate electrode in such a polarity as to periodically render the source-to-drain current path of said transistor conductive, and means direct current conductively connecting said gate electrode to said substrate.

4. The combination with a high frequency signal translating circuit for composite signals, including periodic signal peaks, of a coupling capacitor in said circuit and a source of clamping voltage for said circuit, an insulated-gate field-effect semiconductor device having a current conductive path connected between the output side of said coupling capacitor and said source of clamping voltage, said semiconductor device having gate, source and drain electrodes on a substrate of semiconductor material with said current conductive path between said source and drain electrodes, and rectifying junctions between said substrate and said source and drain electrodes, a keying pulse supply circuit connected to said gate electrode, a coupling capacitor in said connection, and means including one of said rectifying junctions providing a direct-current conductive connection between said gate electrode and the source electrode, whereby the signal translating circuit is clamped in response to keying pulses applied to said gate electrode.

References Cited by the Examiner

UNITED STATES PATENTS 3,013,116 12/1961 Sziklai ______________ 178—7.5

OTHER REFERENCES

Seely: "Electron Tube Circuits," 2nd Ed., McGraw-Hill, New York, 1958.

Kiver: "Transistors," 2nd Ed., McGraw-Hill, New York, 1959.

Szekely: "Integrated Linear Audio Frequency Amplifier," RCA, TN454, September 1961.

DAVID G. REDINBAUGH, *Primary Examiner.*

J. McHUGH, *Assistant Examiner.*